United States Patent [19]

Chida et al.

[11] Patent Number: 4,831,288

[45] Date of Patent: May 16, 1989

[54] DIRECT PARALLEL CONNECTION CIRCUIT OF SELF-TURN-OFF SEMICONDUCTOR ELEMENTS

[75] Inventors: Katsunori Chida; Sigeo Tomita; Kenji Koga, all of Hitachi, Japan

[73] Assignee: Hitachi, Ltd., Tokyo, Japan

[21] Appl. No.: 53,619

[22] Filed: May 26, 1987

[30] Foreign Application Priority Data

May 26, 1986 [JP] Japan ................................. 61-119251
Feb. 27, 1987 [JP] Japan ................................. 62-42638

[51] Int. Cl.[4] ................. H03K 17/72; H03K 17/06; H03K 17/12; H03K 17/60
[52] U.S. Cl. ................................... 307/633; 307/254
[58] Field of Search ................................ 307/633, 254

[56] References Cited

U.S. PATENT DOCUMENTS 3,778,639 12/1973 Higuchi et al. ..................... 307/254
4,234,805 11/1980 Carlsen II ............................ 307/254
4,356,408 10/1982 Glennon .............................. 307/254
4,567,379 1/1986 Corey et al. ........................ 307/254

Primary Examiner—John Zazworsky
Attorney, Agent, or Firm—Antonelli, Terry & Wands

[57] ABSTRACT

A direct parallel connection circuit of gate turn-off thyristors wherein a plurality of GTO's having different current capacities are directly connected in parallel. A turn-on gate current and a turn-off gate current are passed to the gate of each of GTO's through a resistor and a reactor, respectively so as to substantially simultaneously turn-on and turn-off GTO'S, respectively.

6 Claims, 5 Drawing Sheets

DIRECT PARALLEL CONNECTION CIRCUIT OF SELF-TURN-OFF SEMICONDUCTOR ELEMENTS

BACKGROUND OF THE INVENTION

This invention relates to a direct parallel connection circuit of self-turn-off semiconductor devices or elements such as gate-turn-off thyristors (hereinafter referred to as GTO) and transistors, and more particularly to a direct parallel connection circuit of self-turn-off semiconductor elements wherein self-turn-off semiconductor elements designed to have different current capacities, respectively are directly connected in parallel, and turn-on and turn-off operations are adapted to be simultaneously performed to dispose any current capacity.

Direct parallel connection of GTO's having the same current capacity is previously known, and one example thereof has been proposed in U.S. Pat. No. 4,612,561.

FIG. 9a shows an equivalent circuit of the construction disclosed in the above patent. In FIG. 9a, GTO1 and GTO2 having the same current capacity are connected in parallel with their gates being connected to each other via a auxiliary gate wire Ga and their cathodes being connected to each other via a auxiliary cathode wire Ka. A turn-on power supply 3 and a turn-off power supply 4 are connected in series with each other. A transistor 5, a resistor 6, a reactor 7 and a thyristor 8 are connected in series between the power supplies. The midpoint between the resistor 6 and the reactor 7 is connected with the common gate terminal G of GTO's 1 and 2, and the midpoint of the power supplies 3 and 4 is connected with the auxiliary cathode wire Ka. A and K are main terminals to which the anodes and cathodes of GTO's 1 and 2 are connected, respectively.

The feature of this prior art resides in the provision of the auxiliary gate wire Ga and the auxiliary cathode wire Ka.

When a signal is supplied to the transistor 5, a gate turn-on current flows to the gate G whereby GTO's 1 and 2 having the same current capacity are turned on. On the other hand, when a signal is supplied to the thyristor 8, a gate turn-off current flows to the gate G whereby GTO's 1 and 2 are turned off. In this case, if GTO's 1 and 2 have substantially the same static/transient property, the currents $i_{A1}$ and $i_{A2}$ flowing through GTO's 1 and 2 are balanced, when GTO's 1 and 2 are turned on/off, by the action of the auxiliary gate wire Ga and the auxiliary cathode wire Ka, as shown in FIG. 9b. Therefore, the composite current capacity can be taken up to the value of the current capacity of each GTO multiplied by the number of GTO's connected in parallel (Actually, the above composite current capacity can be only near the possible maximum current capacity due to the derating considering the variations of the respective element property).

In FIG. 9b, $v_{AK}$ is an anode-cathode voltage of GTO's 1 and 2, $i_{GON1}$, $i_{GON2}$ are turn-on currents of GTO's 1 and 2, respectively and $i_{GOFF1}$, $i_{GOFF2}$ are turnoff currents of GTO's 1 and 2, respectively.

In the above prior art parallel connection system of GTO's, in order to preferably turn on/off the parallel connected GTO's, the current capacities of the respective GTO's must be the same. Therefore, if the on/off operation of 450 A is intended when there are two GTO's of 200 A current capacity and two GTO's of 300 A current capacity, the prior art system is not useful. Namely, using two GTO's of 200 A current capacity doesn't permit 450 A to be turned on/off. On the other hand, using two GTO's of 300 A current capacity permits the turn on/off but gives rise to redundant allowance, thereby causing disadvantage in cost.

All the same, it takes a long time to newly design, develop and fabricate GTO's of 225 A or 450 A current capacity. This cannot be a present solution.

The same problem will be also occur when transistors of the same current capacity are connected in parallel.

SUMMARY OF THE INVENTION

An object of this invention is to provide a direct parallel connection circuit of self-turn-off semiconductor elements which can turn on/off any current most efficiently.

Another object of this invention is to provide a new direct parallel connection circuit of self-turn-off semiconductor elements, which can directly connect, in parallel, a plurality of self-turn-off semiconductor elements having different current capacities.

In order to attain these objects, a feature of the direct parallel connection circuit of self-turn-off semiconductor elements in accordance with this invention resides in that at least two self-turn-off semiconductor elements having different current capacities are connected in parallel, and a turn-on control current and a turn-off control current are adapted to flow to the control electrode of each element through a resistor and reactor, respectively, and the resistor and reactor having the values suitable to pass the control current necessary for substantially simultaneously turning on/off the respective elements. More concretely, the turn-on/off control current in proportion to the current capacity of each of the self-turn-off semiconductor elements connected in parallel is supplied to them so that the self-turn-off semiconductor elements having different current capacities are substantially simultaneously turned on/off. In order that the control current is made proportional to the current capacity of the self-turn-off semiconductor element, the turn-on control 25 current is supplied to the control electrode from the same turn-on power supply through the resistor having the value in inverse proportion to the ratio of the current capacities of the elements, and the turn-off control current is supplied to the control electrode from the same turn-off power supply through the reactor or resistor having the value in inverse proportion to the ratio of the current capacities of the elements. The reason why a resistor is used for supplying the turn-on control current is that the peak value of the turn-on control current is defined so that the self-turn-off elements as switching elements can be surely turned on, and the rising rate of the control current di/dt can be increased due to the unexistence of a reactor. The reason why a reactor is used for supplying the turn-off control current is that when the self-turn-off semiconductor element is GTO, it is surely turned off (In the case of transistors, the means other than the reactor can also be used).

Another feature of the direct parallel connection circuit of self-turn-off semiconductor elements according to this invention resides in that the control electrodes of a plurality of self-turn-off semiconductor elements connected in parallel are short-circuited. Strictly speaking, the self-turn-off elements connected in parallel cannot be simultaneously turned off. However, if the control electrodes are previously short-circuited, the turn-off control current supplied to the turn-off element is supplied to the control electrode of the element which is not yet turned off to facilitate the turn-off of the latter. Thus, a plurality of self-turn-off semiconductor elements connected in parallel can be substantially simultaneously turned off.

Incidentally, among the plurality of self-turnoff elements used in this invention, at least one element has only to have a different current capacity from those of the remaining elements.

Hereinafter, this invention will be explained with reference to several embodiments shown in the accompanying drawings.

DESCRIPTION OF THE PREFERRED EMBODIMENTS

Figure 1:
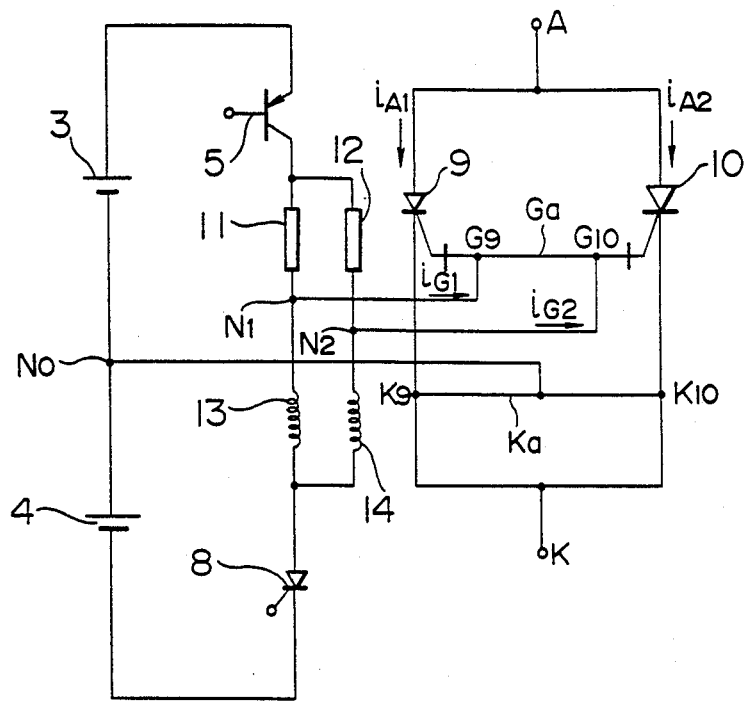
FIG. 1 is a circuit diagram of directly parallel-connected GTO circuit according to one embodiment of this invention.

In FIG. 1, GTO 9 and GTO 10 which have the same rated voltage and different rated current capacity are directly connected in parallel between an anode terminal A and a cathode terminal K. The gates $G_9$ and $G_{10}$ of respective GTO's are connected through an auxiliary gate wire Ga while the cathodes $K_9$ and $K_{10}$ thereof are connected through an auxiliary cathode wire Ka. A closed circuit is constructed by connecting in series a series connection of a turn-on power supply 3 and a turn-off power supply 4; a transistor 5 for switching a turn-on gate current; a parallel circuit of a series connection of a resistor 11 and a reactor 13 and another series connection of a resistor 12 and a reactor 14; and a thyristor 8 for switching a turn-off gate current. A junction point (midpoint) $N_1$ between the resistor 11 and the reactor 13 is connected with the gate $G_9$ of GTO 9, a junction point (midpoint) $N_2$ between the resistor 12 and the reactor 14 is connected with the gate $G_{10}$ of GTO 10, and a junction point (midpoint) N between the turn-on power supply 3 and the turn-off power supply 4 is connected with the midpoint of the auxiliary cathode wire Ka. The values of the resistors 11, 12 and the reactors 13, 14 are in inverse proportion to the rated current capacities of GTO's supplying the turn-on gate current and the turn-off gate current. More specifically, assuming that the rated current capacity of GTO 9 is 200 A and that of GTO 10 is 300 A, the resistances of the resistors 11 and 12 are set to be 3:2, and the inductances of the reactors 13 and 14 are also set to be 3:2. In this case, the resistances of the reactors are desired to be as small as possible and to be set to the same ratio as above. One example of the resistances and inductances, assuming that the voltage of the turn-on and turn-off power supplies is 12 V, is shown in the following table

| resistor 11 | 2Ω | reactance 13 | 0.8 μH |
| resistor 12 | 1.5Ω | reactance 14 | 0.5 μH |

The operation of the direct parallel connected GTO circuit having the construction as mentioned above will be explained.

First, when the transistor 5 is turned on, the turn-on gate currents $i_{G1}$ and $i_{G2}$ corresponding to the rated currents of GTO 9 and GTO 10 are supplied to GTO 9 and GTO 10 through the resistors 11 and 12. The gate trigger current $I_{GT}$ specified from the rated current is smaller in GTO 9 having a smaller rated current than in GTO 10 so that GTO 9 is turned on very slightly earlier than GTO 10. Then, the gate-cathode potential of GTO 9 is increased by the main circuit current $i_{A1}$ so that the potential at the gate $G_9$ becomes higher than that at the gate $G_{10}$. As a result, the current flows from the gate $G_9$ to the gate $G_{10}$ through the auxiliary gate line Ga. This current is added to the turn-on gate current $i_{G2}$ of GTO 10 coming through the resistor 12, thereby increasing the gate overdrive rate of GTO 10 by that extent. Accordingly, GTO 10 is also abruptly turned on so that the main circuit current $i_{A2}$ flows through GTO 10. In this way, the presence of the auxiliary gate line Ga balances the turn-on operation.

By switching on the thyristor 8, the turn-off gate currents $i_{G1}$ and $i_{G2}$ in the direction reverse to the arrows shown in FIG. 1 are caused to flow from the turn-off power supply 4 to GTO's 9 and 10. Then, if GTO 9 has been turned off earlier than GTO 10, the gate cathode impedance of GTO 9 is increased and also the turn-off gate current $i_{G1}$ is abruptly decreased. On the other hand, since GTO 10 is still an on-state, the current from the gate $G_{10}$ to the gate $G_9$ flows through the auxiliary gate wire Ga. Since this current causes a larger turn-off gate current to have flowed to GTO 10, the turn-off of GTO abruptly proceeds, thereby shortening the turn-off time thereof. In this way, the turn-off operation is balanced.

Figure 2:
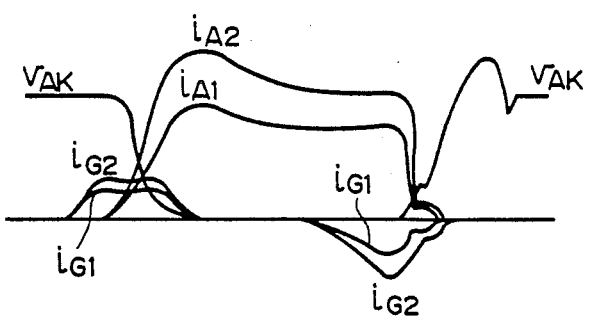
FIG. 2 is a voltage/current waveform chart for explaining the operation of the circuit of FIG. 1.

FIG. 2 shows voltage/current waveforms when the ratio of the rated currents of GTO 9 and GTO 10 is 2:3. $V_{AK}$ is a voltage applied between the anode terminal A and the cathode terminal K. As seen from the figure, in accordance with this invention, even if GTO's having different rated currents are directly connected in parallel, a good turn-on/off operation can be performed (In the on-state, the currents in proportion to the rated currents of GTO's flow therethrough). Thus, when the main current is 450 A, a parallel connection of GTO of 300 A rated current and GTO of 200 A rated current can be used, providing an efficient allowance of only 10%.

The reason why the parallel connection of GTO's having different rated currents result in the improvement will be explained in detail.

GTO is generally constructed by a pnpn four layer structure semiconductor substrate with its n cathode emitter layer(s) being in a strip shape. The number of the strip shape cathode emitter layers is decided by the current capacity of GTO. Each cathode emitter layer is surrounded by a gate electrode film. It can be considered that GTO units each with one end layer of the strip shape cathode emitter layer, corresponding to the number of the strip shape cathode emitter layers are combined in the semiconductor substrate.

Figure 3:
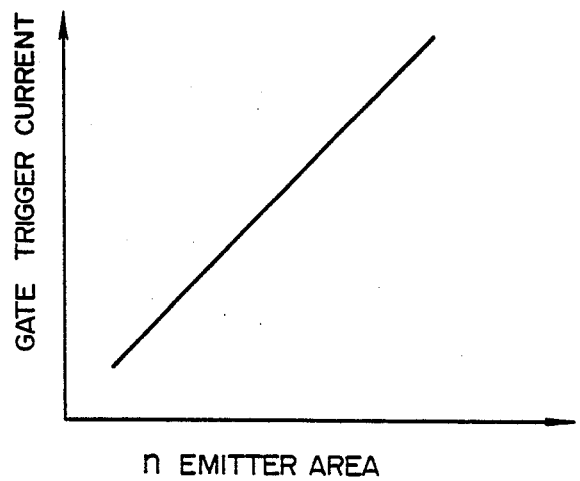
FIG. 3 is a graph showing the relation between the n-emitter area of GTO's and the gate trigger current thereof.

FIG. 3 shows the relation between the area of an n-emitter layer in GTO (i.e. cathode emitter layer) and $I_{GT}$ (i.e. minimum gate current necessary for turn-on of GTO). As understood from the figure, the gate trigger current should be increased with increasing the number of strip shape cathode emitter layers.

Figure 4:
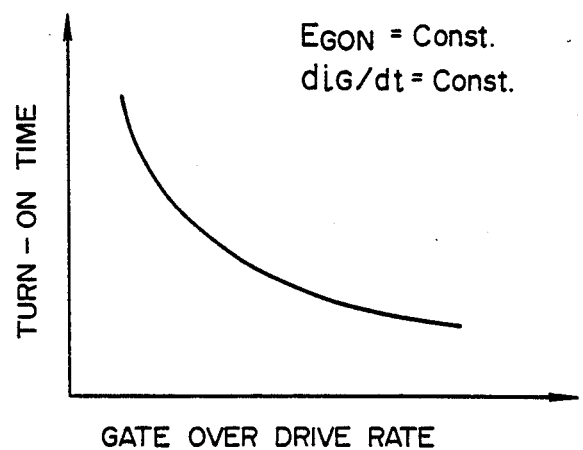
FIG. 4 is a graph showing the relation between the gate overdrive rate of GTO's and the turn-on time thereof.

FIG. 4 shows the relation between the gate overdrive rate OD (the ratio of the peak value $I_{GP}$ of a turn-on gate current to the gate trigger current $I_{GT}$, i.e. OD-$=I_{GP}/I_{GT}$) and a turn-on time. $E_{GON}$ is a voltage of the power supply 3. FIG. 4 reveals that the turn-on time is shortened as the gate overdrive rate become large.

As understood from FIGS. 3 and 4, GTO's having different current capacities, directly connected in parallel, can be substantially simultaneously turned on by passing the turn-on gate currents with the peak value $I_{GP}$ decided so that the gate overdrive rate of each GTO is fixed (The peak value is decided in accordance with the turn-on gate current determined depending on the current capacity of each GTO). Thus, the device breakdown due to di/dt thermal runaway resulting from the current unbalance during the turn-on can be prevented. It should be noted that is shown in FIG. 4, the increasing rate $di_G/dt$ of the on-gate current is set to be equal in each GTO.

During the steady on-state, the current is shared by the respective GTO's so that the current density of each GTO, i.e., the on-voltage thereof is equal. The current sharing ratio corresponds to the ratio of the cathode emitter layer areas of the respective GTO's.

Figure 5:
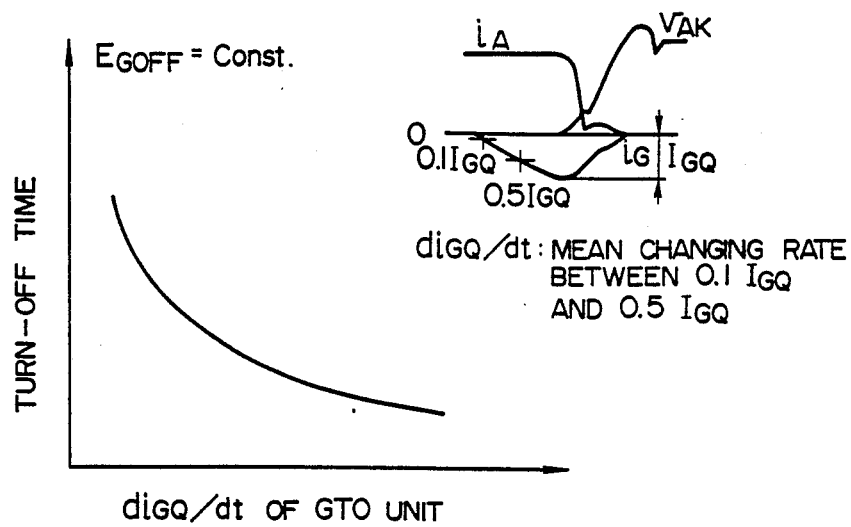
FIG. 5 is a graph showing the relation between the $di_{GQ}/dt$ of GTO unit and the turn-off current of GTO's.

FIG. 5 shows the relation between the mean changing rate $dI_{GQ}/dt$ between 0.1 $I_{GQ}$ and 0.5 $I_{GQ}$ ($I_{GQ}$ is the gate current necessary to turn off each unit) and the turn-off time. $E_{GOFF}$ is the voltage of the power supply 4. In order to uniformly turn off each GTO without concentrating current to a specific GTO unit, $dI_{GQ}/dt$ for each GTO must be equal. This applies also for the GTO's having different current capacities. Therefore, if the ratio of $dI_{GQ}/dt$'s of the respective GTO's is made coincident with the ratio of the current capacities thereof (and so the ratio of the cathode emitter layer areas thereof), $dI_{GQ}/dt$'s of the respective GTO are equal so that the GTO's are simultaneously turned off thereby obviating the failure that the current is concentrated to a specific GTO.

Figure 6:
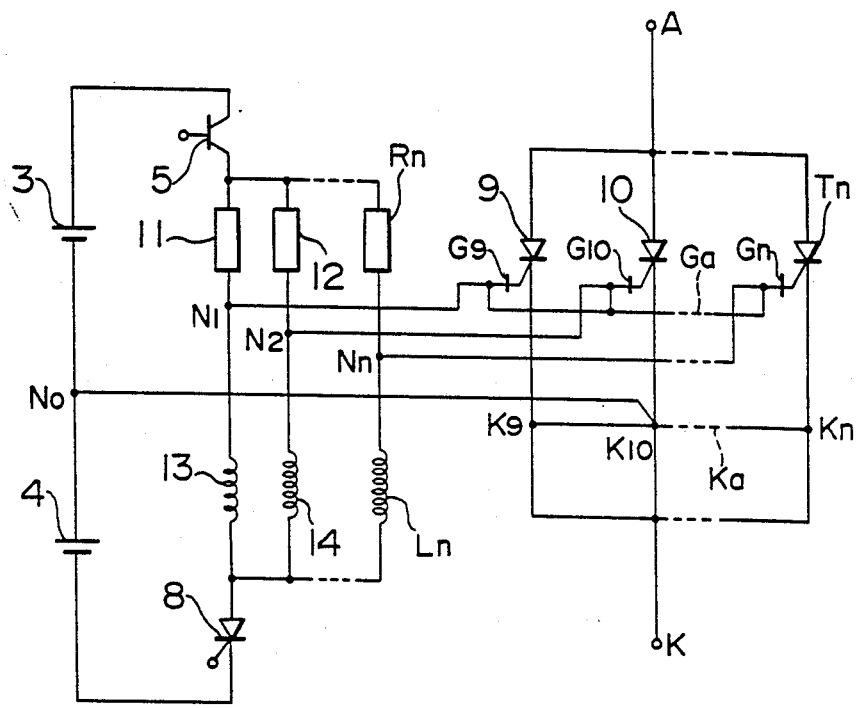
FIG. 6 is a circuit diagram of directly parallel-connected GTO circuit according to another embodiment of this invention.

FIG. 6 shows another embodiment of this invention in which n GTO's are directly connected in parallel. In FIG. 6, like reference numerals and characters refer to like elements in FIG. 1. Tn is a n-th GTO, and Rn and Ln are a resistor and a reactor connected with the gate Gn of GTOTn, respectively.

The n GTO's having different current capacities, directly thus connected in parallel can be also substantially simultaneously turned on/off.

Even if the parallel connected GTO's have different rated currents, structures, properties, etc. except the relations shown in FIGS. 3-5, the forward voltage drop at the same current density and the rated voltage, trouble is avoided.

The power supplies 3, 4, transistor 5 and thyristor 8, etc. used for supplying the turn on/off signals can be substituted by the other power supply means and switching means.

Figure 7:
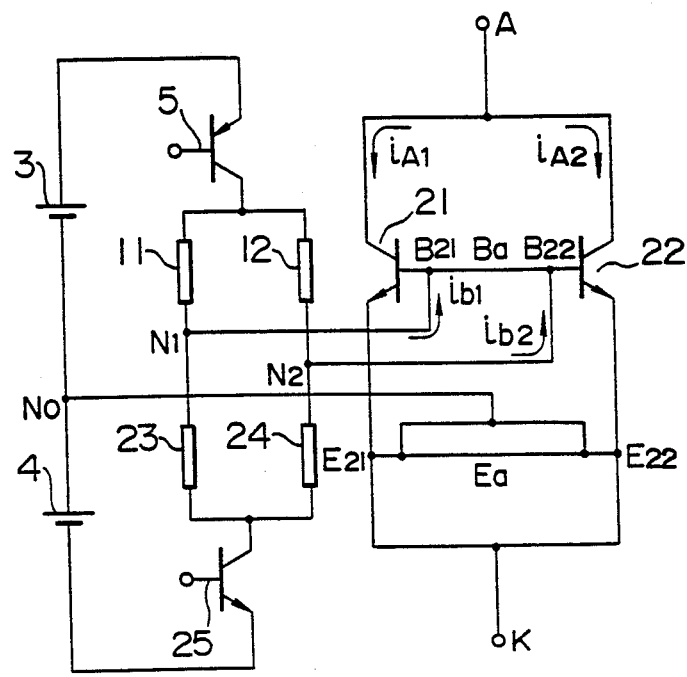
FIG. 7 is a circuit diagram of directly parallel-connected transistor circuit according to still another embodiment of this invention.

FIG. 7 shows still another embodiment of this invention in which two transistors having different current capacities are directly connected in parallel. This embodiment is the same as the embodiment of FIG. 1 except that transistors 21 and 22 in place of GTO 9 and GTO 10, resistors 23 and 24 in place of the reactors 13 and 14, and a transistor 25 in place of the thyristor 8 are arranged. The bases $B_{21}$ and $B_{22}$ of the transistors 21 and 22 are connected with each other through an auxiliary base connection wire Ba. The emitters $E_{21}$ and $E_{22}$ of these transistors are connected with each other through an auxiliary connection wire Ea. The resistances of the resistors 11, 12, 23 and 24 are set as follows.

Figure 8:
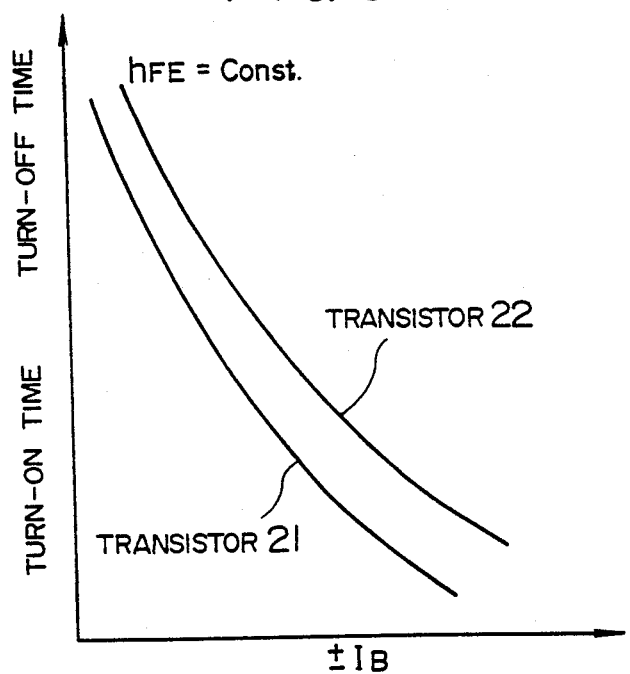
FIG. 8 is a graph showing the relation between a turn-on/off time and $\pm I_B$ with $h_{FE}$ fixed.
Figure 9A:
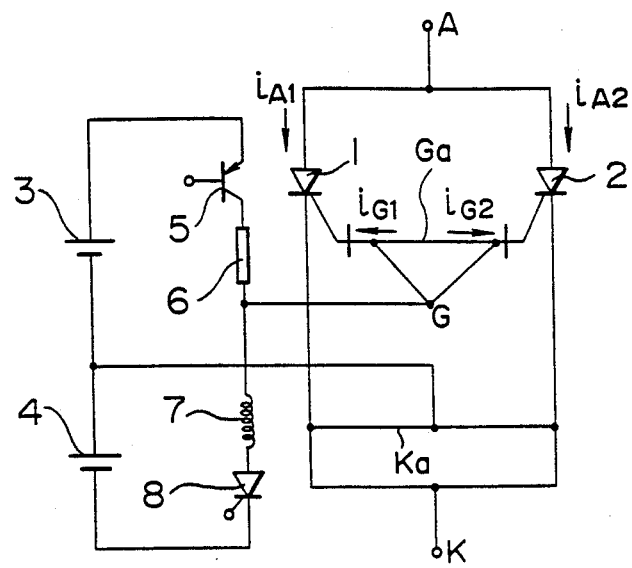
FIGS. 9a and 9b are a circuit diagram of the prior art directly parallel connected GTO circuit and a voltage/current waveform chart for explaining the operation of the circuit of FIG. 1.
Figure 9B:
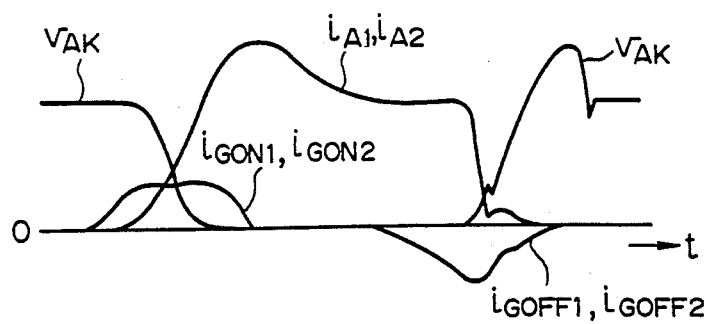

FIG. 8 shows the dependency of the turn-on/off time of a transistor upon the base current $\pm I_B$ ($-I_B$ is the base current flowing the emitter to the base when the transistor is reversed biased, i.e., turned off), with the $h_{FE}$ fixed. The transistor described herein, which is a power transistor for switching, usually $h_{FE}$ of about 100 at the rated current irrespective of the value of the current capacity.

Therefore, if the parallel-connected transistors 21 and 22 having different current capacities have the relation as shown in FIG. 8, the transient characteristic of the respective transistors can be made coincident with each other by selecting $I_B$ and $-I_B$ so that the turn-on/off time for each transistor is fixed, thereby permitting the directly parallel connected transistors having different current capacities to be simultaneously turned on/off.

It should be noted that although during the steady state, the main current is divided so that $V_{CE(sat)}$ for each transistor is constant, the divided current must not exceed the rated current of each transistor.

The selected $I_B$ ($\pm I_{b1}$, $\pm I_{b2}$) may be set, assuming that the voltages o each power supplies are $E_B$ and $-E_B$, respectively and the resistances of the resistors 11, 12, 23 and 24 are $R_{11}$, $R_{12}$, $R_{23}$ and $R_{24}$, respectively, as follows.

For the transistor 21, on: $I_{b1}=E_B/R_{11}$ off: $-I_{b1}=-E_B/R_{23}$, and for the transistor 22, on: $I_{b2}=E_B/R_{12}$ off: $-I_{b2}=-E_B/R_{24}$ In the construction as mentioned above, the directly parallel-connected transistors having different current capacities can dispose of any main current capacity.

As described above, in accordance with this invention, the parallel connected self-turn-off semiconductor elements having different rated currents can on-off control any current most efficiently.

It should be understood that this invention is not limited to the embodiments illustrated in the drawings and that various changes and modifications may be made in this invention without departing from the spirit and scope thereof.

We claim:

1. A direct parallel connection circuit of gate-turn-off thyristors (GTO's), comprising:
   at least two GTO's having different capacities, directly connected in parallel;
   an auxiliary gate wire for connecting gates of said GTO's to each other;
   an auxiliary cathode wire for connecting cathodes of said GTO's to each other;
   a common turn-on power supply for supplying turn-on gate currents to the respective gates of said GTO's through resistors;
   a common turn-off power supply for supplying turn-off gate currents to the respective gates of said GTO's through reactors;
   said resistors being sized to set the turn-on gate currents to be supplied to said GTO's to values corresponding to current capacities of said GTO's, respectively; and
   said reactors being sized to set the turn-off gate currents to be supplied to said GTO's to the values corresponding to the current capacities of said GTO's, respectively.

2. A direct parallel connection circuit of GTO's according to claim 1, wherein said turn-on power supply and said turn-off power supply are in series connection, the midpoint of said series connection is connected with said auxiliary cathode wire, said power supply being connected across each one of said resistors which is series connected with a respective one of said reactors in series connection units, and the midpoint of each of said series connection units is connected with the gate of a corresponding GTO of the at least two GTO's.

3. A direct parallel connection circuit of GTO's according to claim 2, wherein a transistor is connected between said resistors and said turn-on power supply, and a thyristor is connected between said reactors and said turn-off power supply.

4. A direct parallel connection circuit of GTO's according to claim 1, wherein the ratios between the values of said resistors and between the values of said reactors are in inverse proportion to the ratio between the current capacities of said GTO's.

5. A direct parallel connection circuit of transistors, comprising:
   at least two transistors having different current capacities, directly connected in parallel, and
   a common turn-on power supply for supplying, to said transistors, tee turn-on base currents in proportion to the respective current capacities of said transistors; and
   a common turn-off power supply for supplying, to said transistors, the turn-off base currents in proportion to the respective current capacities of said transistors.

6. A direct parallel connection circuit of self-turn-off semiconductor elements, comprising:
   at least two self-turn-off semiconductor elements having different current capacities, directly connected in parallel;
   a common turn-on power supply for supplying, to said semiconductor elements, the turn-on control currents in proportion to the respective current capacities of said semiconductor elements; and
   a common turn-off power supply for supplying, to said semiconductor elements, the turn-off control currents in proportion to the respective current capacities of said semiconductor elements.

* * * * *